United States Patent [19]

Watanabe et al.

[11] 4,179,605
[45] Dec. 18, 1979

[54] COLD TRAP FOR ELECTRON MICROSCOPE

[75] Inventors: Hisao Watanabe; Terukazu Etoh, both of Akishimashi, Japan

[73] Assignee: Nihon Denshi Kabushiki Kaisha, Tokyo, Japan

[21] Appl. No.: 917,288

[22] Filed: Jun. 20, 1978

[30] Foreign Application Priority Data

Jul. 11, 1977 [JP] Japan .............................. 52-91893[U]

[51] Int. Cl.² ........................................... G01M 23/00
[52] U.S. Cl. ..................................... 250/311; 250/457
[58] Field of Search ................................ 250/311, 453

[56] References Cited

U.S. PATENT DOCUMENTS

| | | | |
|---|---|---|---|
| 3,008,044 | 11/1961 | Buchihold | 250/311 |
| 3,387,132 | 6/1968 | Hermann et al. | 250/311 |
| 3,916,201 | 10/1975 | Herman et al. | 250/311 |

Primary Examiner—H. Dixon
Attorney, Agent, or Firm—Webb, Burden, Robinson & Webb

[57] ABSTRACT

A specimen anticontamination device for an electron microscope incorporates a cold trap installed outside the magnetic pole pieces of the objective lens. This cold trap effectively absorbs the residual gases which contribute to the specimen contamination, because its position is nearer the residual gas source than the conventional cold trap installed near the specimen and inside the magnetic pole pieces. For this reason, the device is very effective as an anticontamination means particularly in electron microscopes having a narrow objective lens pole piece gap wherein the space available would preclude installation of the conventional anticontamination device.

4 Claims, 4 Drawing Figures

COLD TRAP FOR ELECTRON MICROSCOPE

BACKGROUND

This invention relates to a specimen anticontamination device for use in an electron microscope.

In a conventional transmission type electron microscope, an electron beam of uniform intensity and comparatively large cross-sectional diameter irradiates a microarea of a thin film specimen. As a result, hydrocarbon gas molecules contained in the residual gas molecules near the specimen surface are polymerized and deposited on the surface of the specimen as contamination. This is an undersirable phenomenon which precludes high quality microscope image formation. The residual gases in the vicinity of the specimen are mainly attributable to the presence of (silicon or other) grease on the vacuum seal of the specimen exchange mechanism and on the vacuum seal of the objective lens aperture adjusting mechanism, etc.

A high degree of evacuation in the vicinity of the specimen is of prime importance. Now, some electron microscopes incorporate a cold trap near the specimen as an extra measure for reducing contamination. However, the conventional cold trap itself is incapable of sufficiently reducing the formation of contamination on the specimen surface to enable long time observation of the microscope image.

In conventional transmission type electron microscopes where the objective lens pole piece gap is fairly wide, there is sufficient room to install a cold trap near the specimen. This is not so, however, in the case of high resolution transmission type electron microscopes. In this case, a narrow gap is essential in order to reduce spherical and chromatic aberrations by generating a highly intense magnetic field in the vicinity of the specimen. Moreover, the optimum specimen position lies on a plane rather adjacent to the lower pole piece. Accordingly, the limited space in the pole piece gap precludes installation of the cold trap therein.

Another factor of consequence, although unrelated to the positioning of the cold trap, is that, in order to obtain a diffraction pattern or energy spectrum of the electrons transmitted through the specimen, it is necessary to irradiate the specimen with a highly condensed electron beam. And, since, in this case, the beam intensity per unit area of the electron beam is much higher, the rate of the contamination build-up increases. The rate of increase is such that a conventional cold trap is insufficient to keep specimen contamination down to negligible proportions.

Still another factor of consequence, this time relating to the positioning of the cold trap, is that, in the case of a scanning electron microscope where a finely focused electron beam is scanned over a selected area of the specimen surface, installing the cold trap in the objective lens pole piece gap precludes effective rapid beam scanning, since eddy currents are produced in the cold trap when the scanning coil is energized.

Accordingly, one object of the subject invention is to prevent or greatly reduce the formation of contamination on the specimen surface when a finely condensed electron beam irradiates a fixed point on the specimen surface or the microscope image is observed for a long time.

Another object of this invention is to similarly prevent or greatly reduce the formation of contamination on the specimen surface in the case of high resolution transmission type electron microscopes where the objective lens pole piece gap is narrow.

SUMMARY OF THE INVENTION

Briefly, according to this invention, an electron microscope is provided with a cold trap outside the magnetic pole pieces whereas in the past the cold trap has been suspended from and within the upper magnetic pole piece of the objective lens. A typical objective lens comprises two magnetic pole pieces which, in cooperation with the flux conducting yoke and electromagnetic coils, provide the magnetic field defining the objective lens. The specimen and objective lens aperture plate are positioned within this field. According to this invention, a cylindrical cold trap is positioned just outside of the magnetic pole pieces radially outward of the specimen and aperture plate but within the yoke. The means for supporting the specimen and the aperture plate pass through openings in the cold trap. The temperature of the cold trap is maintained very low by a means containing a liquefied gas connected to the trap by a heat conducting element passing through the yoke.

According to a preferred embodiment, the cold trap further comprises small cylindrical sleeves extending away from the openings provided in the cold trap for the specimen and aperture plate holders.

THE DRAWINGS

The following describes the subject invention in detail in conjunctin with the accompanying drawings of which:

DESCRIPTION OF THE PREFERRED EMBODIMENTS

Figure 1:
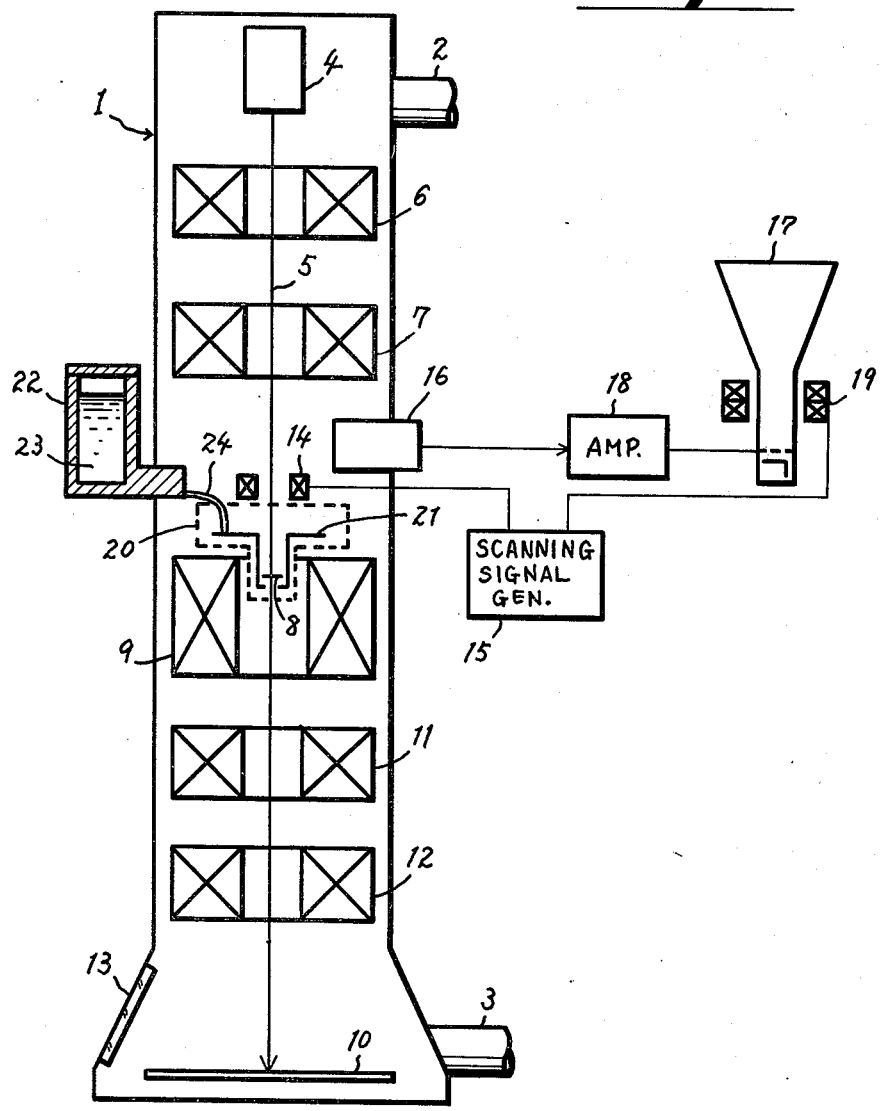
FIG. 1 is a schematic drawing showing one embodiment of this invention.

Referring to FIG. 1, an electron optical column 1 is kept in a state of high vacuum by means of vacuum pumps (not shown) linked to said column 1 via conduits 2 and 3. An electron gun 4 arranged in the upper part of the column 1 generates an electron beam 5 which irradiates a specimen 8, located inside an objective lens 9, after passing through first and second condenser lenses 6 and 7. The electrons constituting the electron beam 5 which pass through the specimen 8 are projected onto a fluorescent screen 10 in the form of a microscope image by the action of the objective lens 9 and image forming lenses 11 and 12. The fluorescent screen 10 then converts the microscope image into an optical image by changing the electron beam intensity into visible light brightness intensity, thereby enabling the image to be viewed through the viewing window 13. In this mode of image observation (EM mode), the first and second condenser lenses 6 and 7 operate to keep the electron beam 5 more or less parallel. Accordingly, the intensity distribution of the electron beam is almost uniform over the entire portion of the area of the specimen being irradiated. On the other hand, in the SEM (scanning electron microscope) image mode, the first and second condenser lenses 6 and 7 operate to converge the electron beam 5 on the surface of the specimen 8. The electron beam is then made to two-dimensionally scan a certain microarea of the specimen by the action of a scanning coil 14 energized by a scanning signal generator 15. Secondary electrons emitted from the specimen 8, concomitant with the scanning of the electron beam, are collected and detected by a detector 16, the output of which is fed into a cathode-ray tube (CRT) 17 via an amplifier 18 as a brightness modulation signal. The scanning signal generator 15, in addition to energizing the scanning coil 14, energizes a scanning coil 19 forming part of the CRT 17. Accordingly, the scanning of the CRT screen and the scanning of the specimen are synchronized, and a scanning image of the specimen is displayed on the CRT screen.

Observation modes other than the EM and SEM modes are often utilized in universal type electron microscopes. For example, in order to obtain a diffraction pattern or analyze the energy spectrum of the electrons transmitted through the specimen, a mode is used whereby the finely converged electron beam irradiating an optical position (microarea) on the specimen surface is stopped.

In the above described observation modes, the specimen is held (or exchanged) by a specimen control device 20. Moreover, by connecting a cold trap 21 to a tank 22 filled with liquid nitrogen 23 or any other suitable refrigerant by means of a flexible and thermal conducting member 24, hydro-carbon gas molecules contained in the residual gas molecules near the specimen surface are absorbed by the cold trap 21. By so doing, the build-up of contamination on the specimen surface is reduced to negligible proportions.

Figure 2:
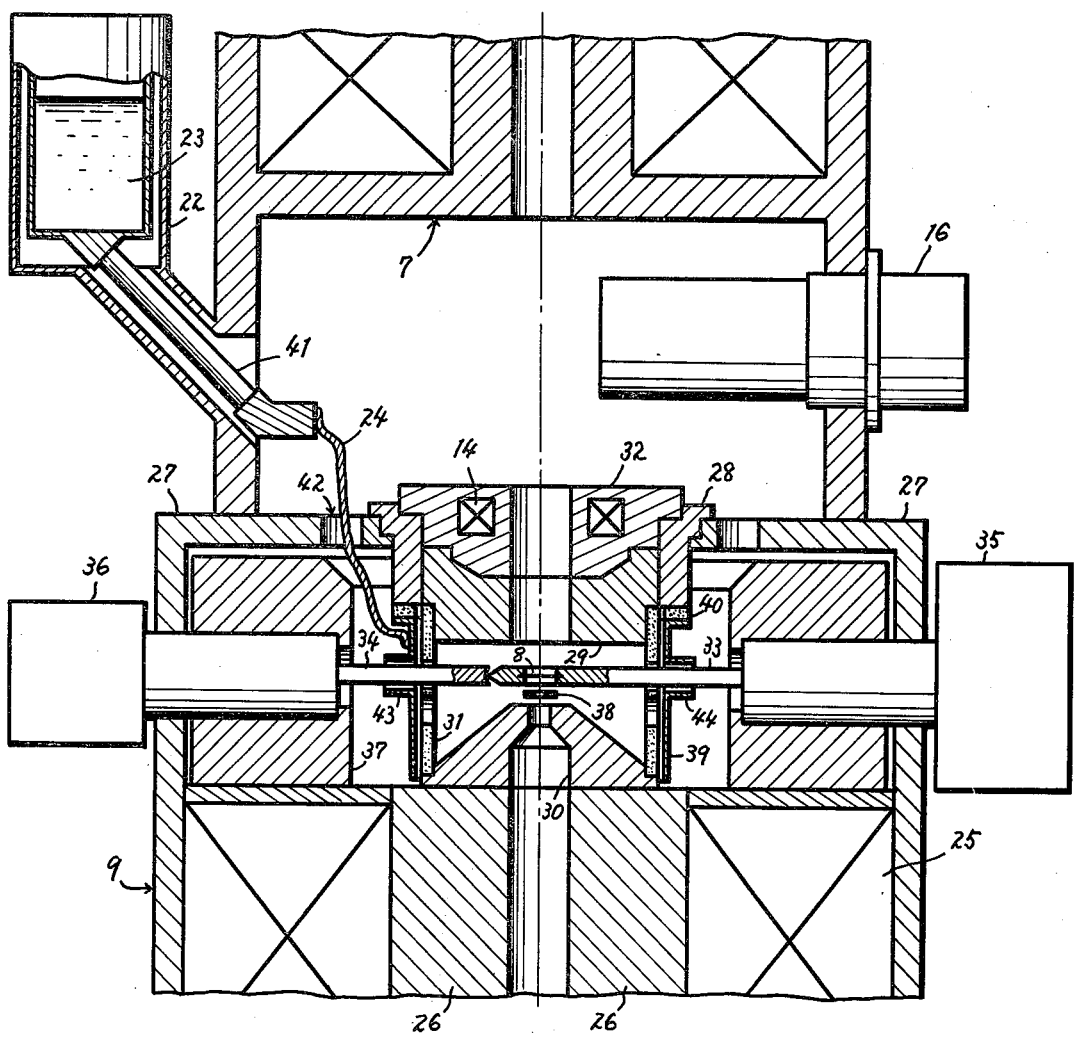
FIG. 2 is a side view of the essential part of the embodiment shown in FIG. 1.

FIG. 2 shows in more detail the essential part of the embodiment shown in FIG. 1. In the figure, the constituent parts having index number corresponding to those in FIG. 1 are identical. The configuration as show permits prevention of contamination build-up on the specimen surface without a conventional cold trap being installed inside the ring-shaped magnetic pole piece of the objective lens 9. In this design arrangement, an objective lens coil 25 is enveloped by yokes 26, 27 and 28 which, except for the ring-shaped spacer in which the upper and lower magnetic pole pieces 29 and 30 are housed, are made of a magnetic material. The upper and lower magnetic pole pieces 29 and 30 are connected rigidly by a non-magnetic spacer 31. Moreover, said pole pieces and spacer can be interchanged with other differently shaped pole pieces and spacers in order to execute various observation modes. In this structure, since almost all the magnetic flux generated by the objective lens coil passes through yokes, 26, 27 and 28, the upper and lower magnetic pole pieces 29 and 30, and the narrow pole piece gap, a strong objective lens magnetic field, symmetrical with respect to the optical axis Z, is generated. The scanning coil 14 is embeded in a non-magnetic molding 32 which is shaped so as to fit snugly onto the upper magnetic pole piece 29. The specimen 8 is held in the objective lens field by a rod 33 which operates in conjunction with a second rod 34 to position the specimen as desired within said field and also to remove the specimen from the beam path and into the atmosphere in order to carry out specimen exchange. The rods 33 and 34 which pass through the spacer 31 are controlled or driven by specimen control units 35 and 36. The specimen control units 35 and 36 are supported and held by a support member 37. By so doing, the specimen 8 can be shifted optionally along a plane perpendicular to the optical axis Z, or inclined, or rotated. Accordingly, sufficient space must be provided around the specimen, particularly below the specimen, depending of course on the maximum tilt angle available. Moreover, sufficient space must be provided for installing an aperture plate 38 which is necessary in order to block the electrons scattered by the specimen. This aperture plate is held and supported by an aperture insertion and removal device (not shown), the shaft of said device passing through the spacer 31 at right angles to rods 33 and 34.

A cylindrical cold trap 39 is arranged outside the pole piece gap. The cold trap 39 is supported by a yoke 28 via a thermal insulator 40. A flexible and heat conducting member 24 made up of many strips of copper wire connects the cold trap to one end of pipe 41. The member 24 passes through a yoke through hole 42. The other end of the pipe 41 is connected to a tank 22 filled with liquid nitrogen 23. By so doing, the temperature of the cold trap is kept at about 140 degrees K.

Figure 3:
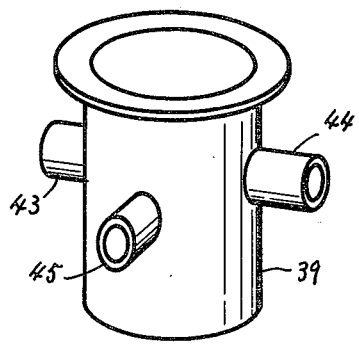
FIG. 3 is a fragmentary schematic showing one part of the embodiment shown in FIG. 2.

FIG. 3 shows the cylindrical cold trap 39 in more detail. Sleeves 43, 44 and 45 permit rods 33 and 34 and also the shaft forming part of the aperture insertion and removal device (not shown) access to the specimen area. Accordingly, the hydro-carbon gas molecules flowing towards the specimen along said rods, etc. are effectively absorbed by said sleeves. Contamination build-up on the specimen is therefore minimal, this particular design of cold trap in fact being more effective in combating contamination growth than the conventional cold trap installed in the upper pole piece.

Figure 4:
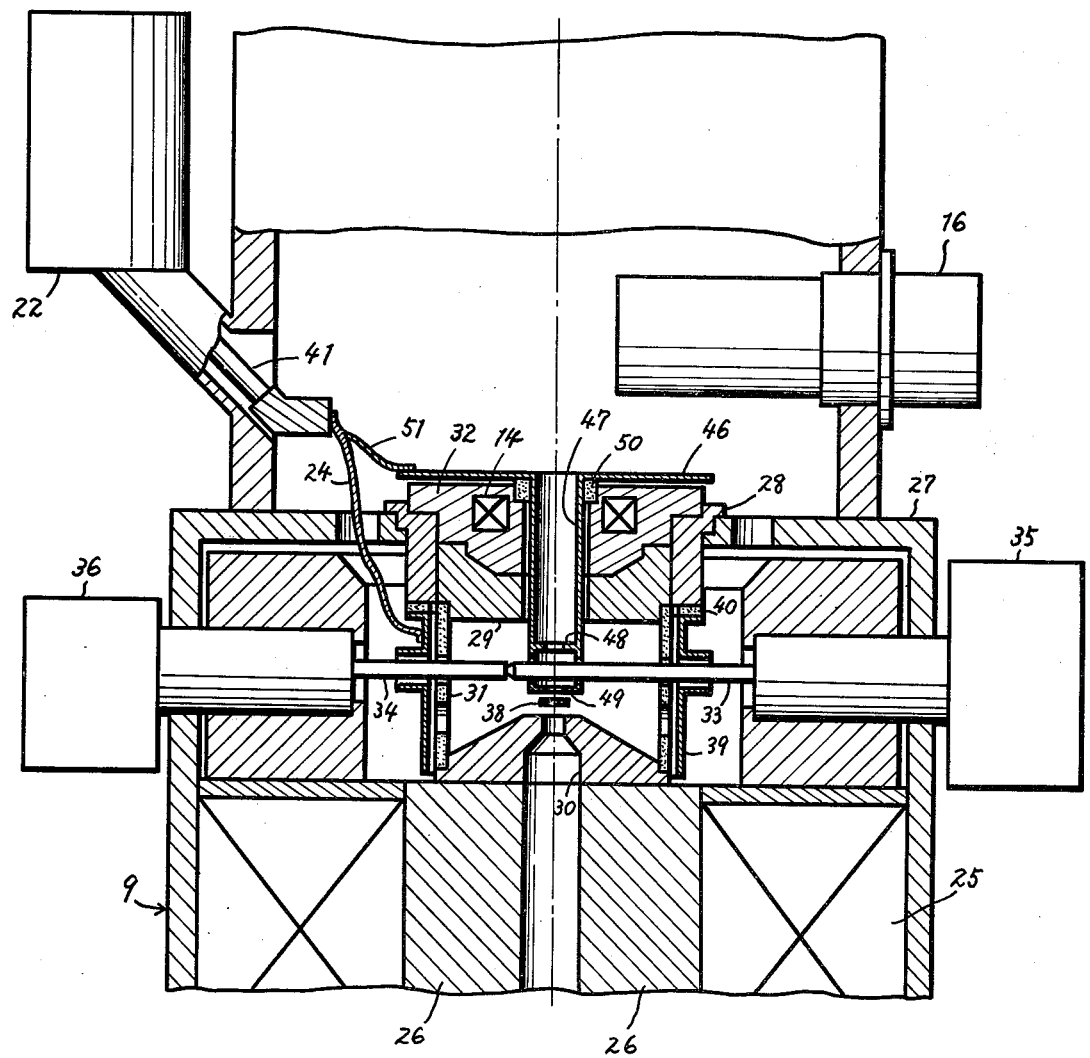
FIG. 4 shows a cross-sectional view of the essential part of another embodiment according to this invention.

FIG. 4 shows another embodiment according to this invention. In the figure, the constituent parts having index numbers corresponding to those in FIGS. 1 and 2 are identical. In this embodiment, since the upper and lower magnetic pole piece gap is wide, two cold traps are incorporated and external cold trap 39 and an additional conventional cold trap 46. The conventional cold trap, which consists of a cylindrical portion 47 and inner ring plates 48 and 49 between which the specimen 8 is placed, is supported by a molding 32 via a non-magnetic thermal insulating ring 50 and is connected to the pipe 41 by means of a flexible and heat conducting member 51. By so doing, contamination build-up on the specimen is effectively prevented even when a finely converged electron beam is stopped at a fixed point on the specimen surface as is the case in some observation modes.

Having thus defined our invention in the detail and with the particularity as required by the Patent Laws, what is desired protected by Letters Patent is set forth in the following claims.

We claim:

1. In an electron microscope the improvement comprising an objective lens having two annular coaxial magnetic pole pieces closely spaced axially and between which a specimen holder and an objective lens aperture plate are located, said annular pole pieces being axially spaced by an annular non-magnetic spacer, a cylindrical cold trap positioned radially outside the non-magnetic spacer and the space between said magnetic pole pieces, and means for cooling the trap such that residual gas molecules are absorbed by said trap, thereby preventing or substantially reducing the build-up of contamination on the specimen.

2. An electron microscope according to claim 1, further comprising small cylindrical sleeve on said cylindrical cold trap through which several rods pass to position the specimen and aperture plate inside the pole pieces.

3. In an electron microscope the improvement comprising an objective lens having two magnetic annular coaxial pole pieces between which a specimen holder and an objective lens aperture plate are located, said annular pole pieces being axially spaced by an annular non-magnetic spacer, a first cylindrical cold trap installed radially outside the non-magnetic spacer and the space between the magnetic pole pieces, a second cold trap installed inside at least one of said magnetic pole pieces and near the specimen, and means for cooling said first and second cold traps, thereby preventing or substantially reducing the build-up of contamination on the specimen.

4. An electron microscope according to claim 3, further comprising small cylindrical sleeves on said first cold trap through which several rods pass to position the specimen and aperture plate inside the pole pieces.

* * * * *